United States Patent [19]

Murad

[11] 4,128,871
[45] Dec. 5, 1978

[54] HIGH VOLTAGE DC POWER SUPPLY

[75] Inventor: Sammy Y. Murad, Fountain Valley, Calif.

[73] Assignee: Wahlco Inc., Santa Ana, Calif.

[21] Appl. No.: 805,250

[22] Filed: Jun. 10, 1977

[51] Int. Cl.² .............................................. H02M 7/00
[52] U.S. Cl. .................................... 363/144; 307/149; 361/331
[58] Field of Search ................. 307/147, 149, 150; 336/90; 361/331, 385; 363/141, 144, 146, 126

[56] References Cited

U.S. PATENT DOCUMENTS

| 3,369,166 | 2/1968 | Lake | 363/141 X |
|---|---|---|---|
| 3,445,747 | 5/1969 | Laurent | 363/141 X |
| 3,470,444 | 9/1969 | Bixby | 363/126 X |
| 3,564,386 | 2/1971 | Leonard | 363/141 |

*Primary Examiner*—William M. Shoop
*Attorney, Agent, or Firm*—Howard E. Sandler

[57] ABSTRACT

A high voltage DC power supply including a high voltage transformer having output bushings extending from the transformer housing, and a rectifier unit mounted between the high voltage bushings. The rectifier unit is housed in an electrically nonconducting tank which contains a rectifier assembly immersed in an insulating liquid. The power supply has a common high voltage clearance space for both the transformer bushings and the rectifier unit.

13 Claims, 4 Drawing Figures

HIGH VOLTAGE DC POWER SUPPLY

This invention relates to a high voltage DC power supply having a nonconducting tank mounted between the high voltage output bushings of a transformer. The tank contains a rectifier assembly submersed in an oil bath. Both the high voltage transformer and rectifier assembly use a common high voltage clearance space.

BACKGROUND

For many industrial applications, it is desirable to have a low cost high voltage DC power supply. One such application, for example, is the use of high voltage DC in electrostatic precipitators for pollution control. To obtain such high voltage DC power a step-up transformer connected to commercial power lines and a rectifier connected to the output of the transformer can be used. The high voltage output of the transformer may vary from about 10 KV to several hundred KV depending upon the application. Because of the magnitude of such voltage a high voltage clearance space must be provided around the terminals of all such devices.

Because of the high voltage present inside high voltage transformers and rectifiers and to enhance cooling of such devices, it is common to immerse these devices in an insulating liquid such as oil. Such oil immersed devices are contained in metal housings having the high voltage connections brought to the exterior of the metal, conductive, housing by means of a set of high voltage bushings. These bushings are brought out of the tank in a spaced relationship to provide adequate high voltage clearance between bushings. When a separate transformer and high voltage rectifier are used to form a DC power supply, adequate high voltage clearance must be provided for the terminals of both devices. U.S. Pat. No. 3,805,140 is an example of a separate oil filled rectifier and required insulation. In many applications the additional space required is not available or increases the installation cost.

PRIOR ART

One solution to this problem has been to incorporate the rectifier unit into the transformer unit resulting in a single set of high voltage bushings, U.S. Pat. Nos. 3,564,386 and 3,445,747 are representative of such combined units. While such units result in a reduction in the high voltage clearance required, they are more costly than standard units and require a larger transformer tank. In addition, such transformer and rectifier using a common tank often require special diodes, bushings and sophisticated repair techniques.

SUMMARY

Accordingly, one object of this invention is to provide a high voltage DC power supply which is inexpensive to manufacture and free from complex component parts.

Another object of this invention is to provide a DC power supply requiring minimal high voltage clearance for output terminals.

Still another object of this invention is to provide a rectifier unit which is small, low in cost, and compatible with existing standard high voltage transformers.

A more specific object of this invention is to provide for a rectifier unit which can be mounted in the existing high voltage clearance of a standard transformer.

I provide for a standard high voltage transformer and a rectifier unit mounted between the output bushings of the transformer using the same high voltage clearance space generally required in a standard transformer. Standard high voltage transformers have their output terminals passing through the transformer housing and extending a vertical voltage clearance distance from the transformer housing by means of an output bushing. Such bushings are usually composed of porcelain or other types of insulating material with an exposed conductor terminal at the tip. These bushings are insulated from each other by the air gap between them. This air gap or high voltage clearance between bushings is based upon the insulating qualities of air and the voltage existing between the two bushings. In addition to the high voltage clearance between bushings additional air space must be provided in the installation between each bushing and other conductive surfaces. If a material having better insulating qualities than air were used in the high voltage clearance between bushings the resulting distance between the bushings could be decreased. The dielectric strength or breakdown strength of air is known to be about 0.8 KV/mm. The corresponding dielectric strength of transformer oils such as askerel is approximately 12 KV/mm or higher. Because the standard high voltage transformer is constructed to connect to remotely operated devices the clearance between the output bushings is based upon an air insulator. I provide for the use of this clearance space by the high voltage rectifier unit. By using a bath of liquid having better insulating characteristics than air, the required HV clearance between terminals and bushings on the transformer housing can be significantly reduced.

The rectifier unit comprises a rectifier assembly submerged in an oil bath. The oil bath is of sufficient size to provide insulation between diodes and other components of the rectifier assembly. The bath is contained in a nonconducting tank having AC inputs on opposite sides of the tank. The tank is then mounted on top of the metal transformer housing and between the output bushings. Because the tank is made of a nonconductive material, such as fiberglass for example, its presence does not violate the safety factors required for the high voltage clearance between transformer bushings. The use of a nonconducting liquid within the tank creates in effect, a better insulation barrier between high voltage terminals. The additional insulation factor resulting from the use of oil in the tank is required due to the fact that the high voltage clearance between bushings has been reduced by the presence of the rectifier and the connecting straps used to connect to the transformer.

Additional objects and advantages will be apparent upon reference to the following detailed description and drawings.

DESCRIPTION OF DRAWINGS

In the accompanying drawings are shown a present preferred embodiment of the invention in which.

DESCRIPTION OF PREFERRED EMBODIMENTS

Figure 1:
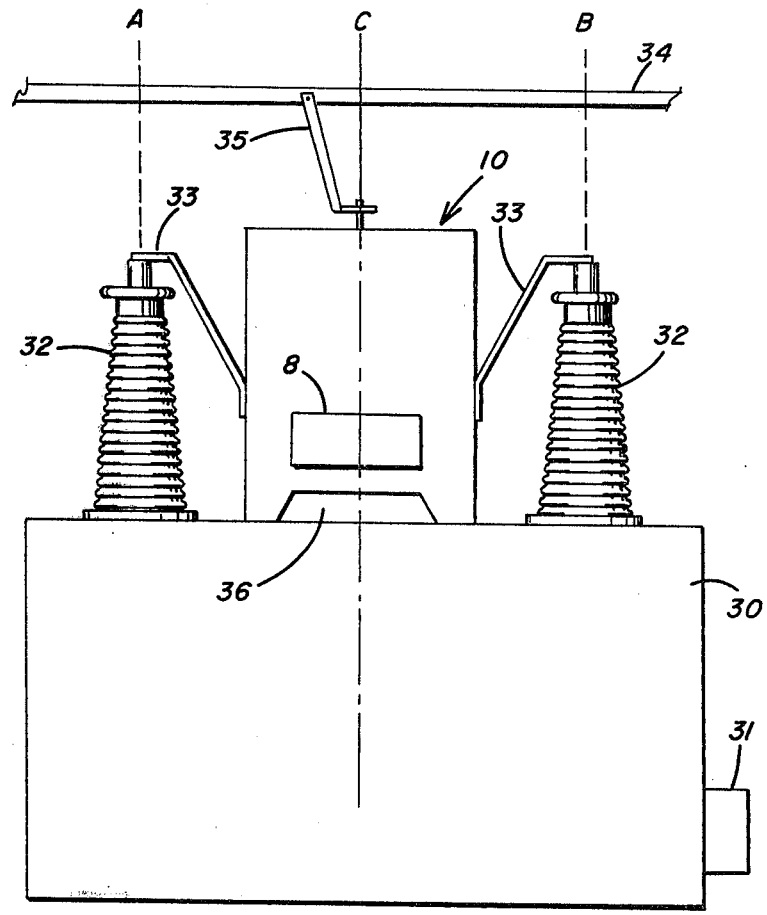
FIG. 1 is a front elevational view showing the transformer, bushings and rectifier unit as attached to a DC bus.

Referring now to FIG. 1, there is shown a high voltage transformer having metal transformer housing 30 and low voltage input terminal box 31. Low voltage AC power is fed into the transformer windings (not shown) internal to the housing 30; and the stepped up high voltage is fed to high voltage output bushings 32. While FIG. 1 shows a single phase high voltage transformer, it is to be understood that the scope of this invention includes polyphase systems as well. The center lines of the output bushings are indicated as A and B respectively. The distance between A and B can generally be considered the high voltage clearance between the output bushings. On standard transformers this distance between A and B is designed with the intention of using only air as an insulator in this space. FIG. 1 shows a rectifier unit generally indicated at 10, occupying a portion of this high voltage clearance space. This rectifier is electrically connected to the output bushings by the AC connecting straps 33. These AC connecting straps act as an input connecting means for transmitting the high voltage AC power from bushings 32 to the rectifier unit 10. The rectifier unit 10 is shown as having center line C positioned generally in the center of the high voltage clearance. The terminal cover 8 shown on the rectifier unit 10 houses means for connecting electrical meters and ground connections. A DC output is shown on top of the rectifier unit 10 positioned on the center line C and connected by DC output connecting strap 35 to the DC bus 34. The construction of the rectifier assembly 10 is such that an air space 36 exists between the tank housing 30 and the rectifier tank itself.

Figure 2:
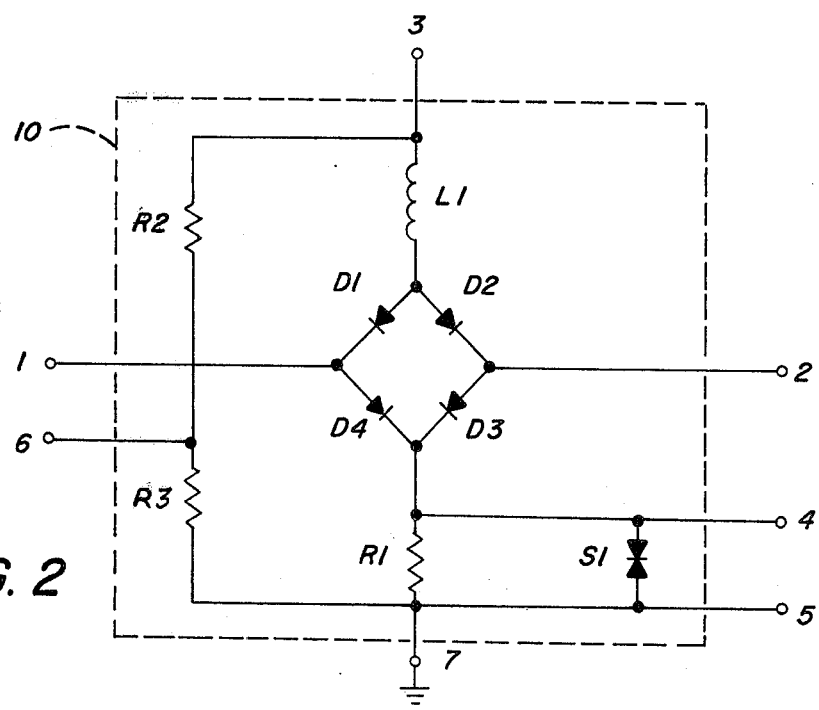
FIG. 2 is a schematic circuit diagram of the rectifier unit.

FIG. 2 shows a schematic diagram of the circuit housed in the rectifier unit. In the center of the diagram is a full wave rectifying bridge composed of diode assemblies D1, D2, D3 and D4. The diode assemblies are each shown as a single diode element but it is understood that such diode assemblies can be composed of numerous individual diode components arranged in series or parallel relationship to achieve proper current and voltage ratings. As will be further detailed this full wave bridge and all diode assemblies are to be immersed in an insulating liquid. The diode bridge is fed AC power through the first AC input terminal, 1 and the second AC input terminal 2. While FIG. 2 shows the preferred embodiment of a full wave rectifier it is to be understood that the scope of the invention would include half wave rectifiers and polyphase rectifiers.

One side of the DC output of the full wave bridge is fed through the current shunt resistor R1 to a DC output terminal. The DC terminal acting as the ground lug terminal 7 can be connected directly to the transformer housing 30 if said transformer housing is grounded. In parallel with the current shunt resistor R1 is a surge arrestor S1 used to protect the circuit from current surges. The current shunt resistor R1 acts as a normal current shunt and the voltage across R1 is fed to the ammeter terminal 4 and ground terminal 5. The output from the terminals 4 and 5 can be connected to additional current measuring means such as a remotely mounted ammeter (not shown).

A series connected inductor L1 is connected between the other DC output of the bridge and the DC output terminal 3 which feeds a DC bus.

The DC output of the rectifier assembly is fed into the voltage divider circuit made up of the voltage dropping resistor R2 and the voltage shunt resistor R3. Provision is made by means of the voltage terminal 6 and the ground terminal 5 to connect a remote voltmeter (not shown) into the circuit. While the preferred embodiment uses shunt resistors and remote meters for measuring and indicating the voltage and current of the rectifier unit, other known means are contemplated within the scope of the invention.

The rectifier assembly D1, D2, D3 and D4 are submersed in an oil bath to provide adequate insulation and cooling. In addition other components shown in FIG. 2 may be submerged in the oil bath where convenient or where the voltage present requires additional insulation.

Figure 3:
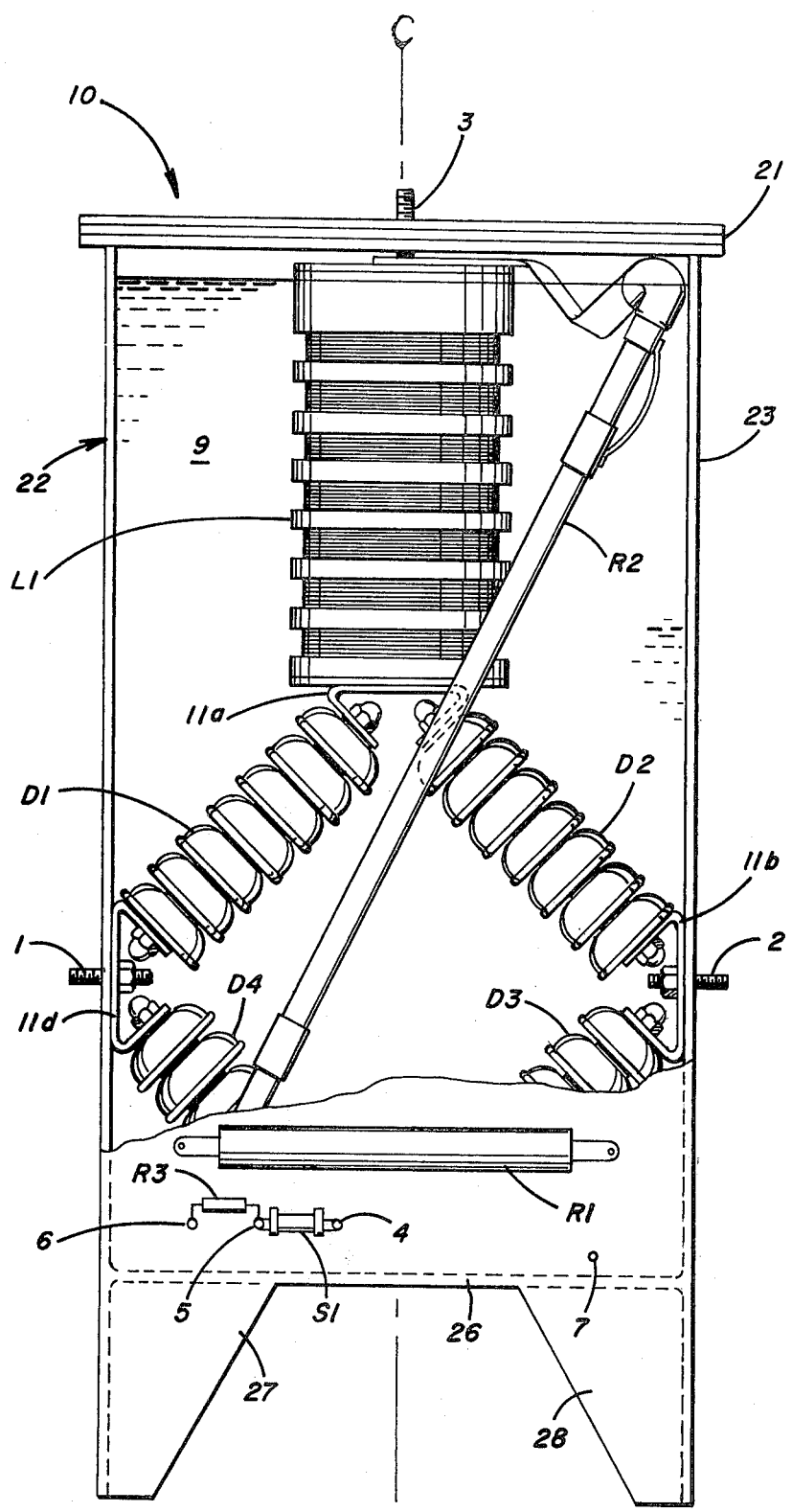
FIG. 3 is a front elevational view of the rectifier unit with the terminal cover and the front cover partially removed showing internal components and the liquid in the tank.
Figure 4:
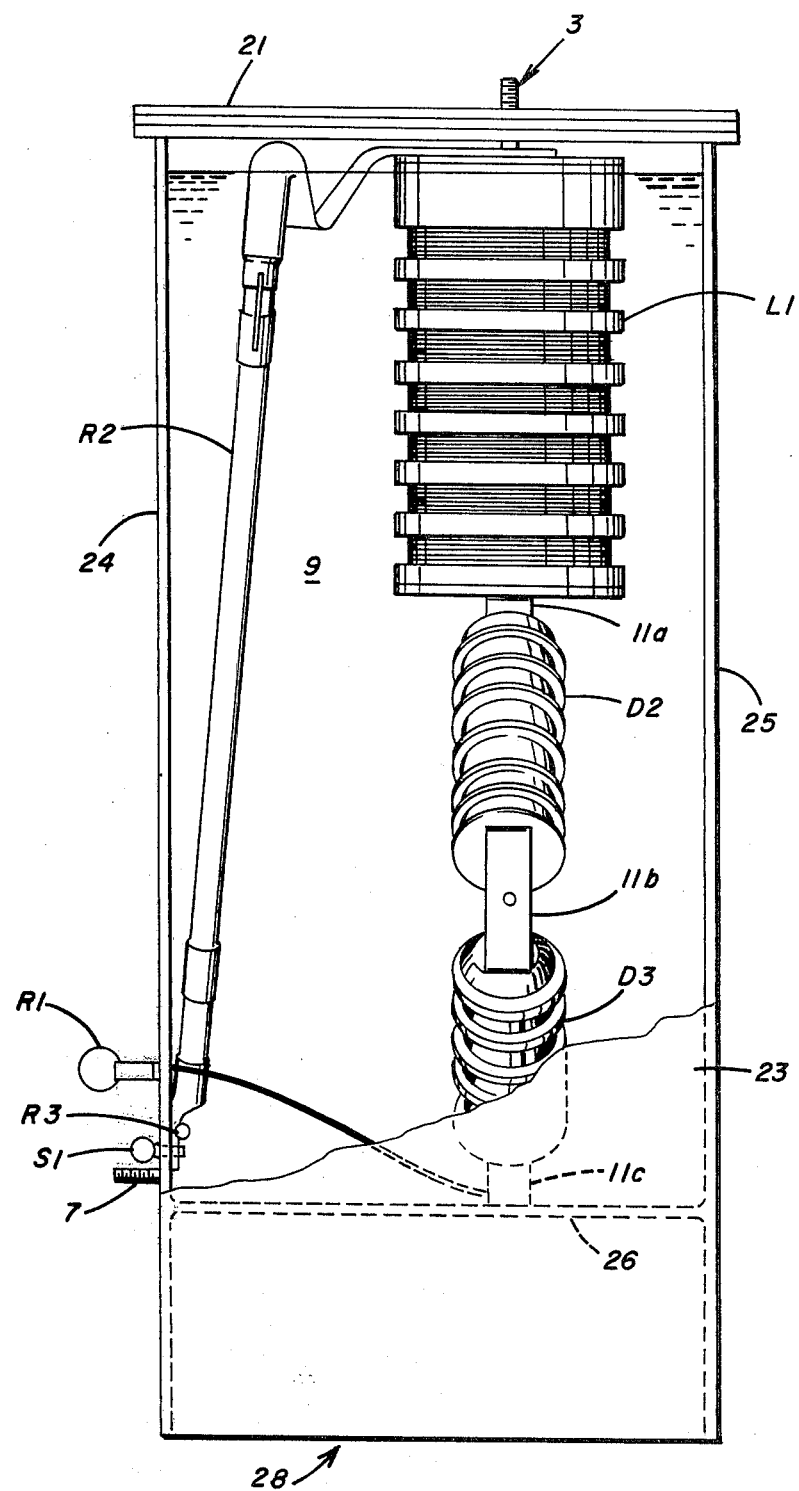
FIG. 4 is a side elevational view of the rectifier unit with the terminal cover and the side cover partially removed showing the internal components and liquid bath.

Referring now to FIG. 3 shows the rectifier unit 10, in an elevational view with the front panel on the tank removed to expose the oil filled interior. The tank is generally constructed with a right side wall 23, left side wall 22, a bottom 26, a top cover 21, and front 24 and rear 25 walls as shown in FIG. 4. This tank provides means for forming or retaining a bath of insulating liquid. All portions of the tank are formed of a nonconducting material, such as plastic, Plexiglass or Fiberglass. One of the requirements in the construction of the tank is sufficient strength to retain the insulating liquid. The bath liquid should be sufficient to electrically insulate the diode assemblies, and improve electrical insulation between the bushings.

The embodiment shown in FIG. 3 was designed to provide 1 amp full wave rectified DC at approximately 105kv peak inverse voltage. As such the diode assemblies D1, D2, D3 and D4 are individually made up of seven diodes arranged in series combination. Such arrangement allows for a proper voltage rating. If higher current ratings are required additional diodes could be added in a parallel combination so as to increase the current capacity of the diode assembly in each leg of the bridge. Diode assemblies D1, D2, D3 and D4 are arranged in a quadrangular shaped full wave bridge; the points of said quadrangle corresponding generally to the brackets 11a, 11b, 11c, and 11d. A first means for delivering AC power to the bridge assembly is provided for by the first AC input terminal 1. A second means for providing AC power to the bridge uses the second AC input terminal 2. This arrangement positions the AC terminals so as to be adjacent the transformer bushings with the rectifier unit mounted intermediate the bushings. One side of the DC output of the bridge is through bracket 11a into the series connected inductor L1 to the DC output terminal 3.

In this embodiment the inductor L1 and the dropping resistor R2 are also immersed in the liquid bath 9. While additional components could be mounted in the oil bath 9 this embodiment has the current shunt resistor R1 and the voltage shunt resistor R3 and the surge arrestor S1 mounted on the exterior surface of the tank beneath the terminal cover 8 which has been removed in FIG. 3. Also mounted under the terminal cover 8 is the ground lug 7. The position of the ground lug 7 allows easy connection to the transformer housing. Terminals 4, 5 and 6 are also mounted beneath the terminal cover 8.

In this preferred embodiment integral with the side wall are two legs 27 and 28 which provide means for mounting the unit on top of the transformer and forming an air space 36 between the bottom of the tank 26 and the transformer housing 30 (FIG. 1). This space provides for additional safety and insulation between the rectifier unit and the transformer. In this preferred embodiment the insulating liquid 9, oil has sufficient cooling capacity so as to operate as a closed system. The heat transferred from the diodes to the oil is then radiated through the surface of the tank to the air. It is within the scope of this invention to use known means for cooling the insulating liquid in rectifier units of sufficient wattage to require additional cooling capacity. In most instances it will be desirable to make a rectifier unit of sufficient size so as to be self contained and require no external cooling of the insulating oil.

As can be seen from FIG. 3 the diode assemblies are arranged in a bridge generally symmetrical about the center line C. In addition the DC output terminal 3 is generally positioned equidistant from the AC input terminals 1 and 2. This provides for a uniform insulation gradiant between input and output terminals. When the rectifier unit is mounted between the output bushings as shown in FIG. 1 the centerline C is equidistant from the output bushings and maximum insulation effect is obtained between the output bushings. This provides for optimum utilization of the high voltage clearance space existing in standard transformers between the output bushings.

FIG. 4 shows a right side view of the rectifier unit with the right wall 23 partially removed and the terminal cover 8 removed. Inductor L1 can be seen connected via bracket 11a which connect the diode assemblies D1 and D2. Bracket 11b can be seen to connect diode assembly D2 to D3 and provide means for supplying an AC input. Bracket 11c which joins diode D3 and D4 is connected to one end of the current shunt resistor R1. In FIG. 4 the voltage shunting resistor R3 is shown alternatively mounted on the interior of the tank, whereas surge arrestor S1 is mounted on the exterior. The junction of the walls can be seen forming the tank legs 28. The insulating liquid 9 covers both the diode assembly D1, D2, D3 and D4, and the inductor L1. The voltage dropping resistor R2 can be seen as it is connected to one side of inductor L1 and to the voltage shunt resistor R3. The tank cover 21 is shown mounted on top of the tank and it is contemplated that the cover may be removable or have bore holes provided so that insulating liquid may be added or removed from the tank.

While the preferred embodiment has been shown as having a negative DC feed to the bus 34 by means of DC output terminal 3; either negative or positive feed could be used. Reversing the direction of the diode assemblies D1, D2, D3, and D4 would facilitate a positive feed unit. The preferred embodiment also shows one of the DC output terminals 7 as grounded. It is within the scope of the invention to provide for an isolated, or underground, DC output.

The rectifier unit shown in the preferred embodiment was designed to operate at 105 KV PIV input and deliver a 1000 MA DC output. The specific component values used are R1 100 ohms, R2 120 Meg ohms and R3 25 K ohms. The value of L1 and S1 depend upon the system in which the power supply is connected; and their calculations are known to those skilled in the art.

It is desirable to position the DC output terminals and the DC connecting strap above the bushings, or higher than the top of the bushings so as to allow adequate HV clearance. These can be positioned so that the DC output bushing is at the uppermost point in the normal vertical HV clearance on standard transformers. The preferred embodiment has shown the DC output terminal equidistant from the bushings and at a further distance from the transformer housing 30 than the vertical height of the bushings. The minimum safe air distance between the DC terminal and the bushings can be calculated using known methods.

The dimensions of the oil bath must be adequate to insulate the rectifier assembly itself and provide insulation equal to or greater than the insulation value of air the normal HV clearance. If the rectifier unit is centered approximately equidistant from the bushings as shown in FIG. 1 then the effective clearance distance has been reduced by one-half. If the AC connecting straps further reduce the HV clearance this reduction must be offset by more insulation from the bath. The size of the bath will vary directly with the reduction in clearance and inversely with the ratio of the dielectric strength of air to insulating liquid. In typical installations of approximately 100 KV the oil bath should occupy about 25% of the distance between the high voltage bushings centerlines. If better insulating liquids are used this percentage could be proportionally reduced.

While the preferred embodiment has been shown as a single phase supply, the same rectifier unit shown could be used in a three phase system. Such a three phase system could include one transformer with three output bushings and a rectifier assembly mounted between each of the respective pairs of bushings forming a delta connection.

Thus it is apparent that there has been provided, in accordance with the invention, a high voltage DC power supply that fully satifies the objects, aims and advantages set forth above. While the invention has been described in conjunction with specific embodiemnts thereof, it is evident that many alternatives, modifications, and variations will be apparent to those skilled in the art in light of the foregoing description, it is intended to embrace all such alternatives, modifications and variations as fall within the spirit and scope of the appended claims.

What is claimed is:

1. A high voltage direct current power supply comprising: a transformer having a metal housing and first and second high voltage output bushings; tank means for retaining a bath of insulating liquid; said tank means formed of an electrically nonconductive material; mounting means for supporting said tank means on said transformer housing intermediate said first and second bushings; a rectifier assembly mounted in said tank means so as to be submersible in said bath; said rectifier assembly having first and second AC input terminals and first and second DC output terminals; input connecting means for electrically connecting said first and second bushiongs to said first and second AC input terminals respectively; and said first DC output terminal being grounded and said second DC output terminal being generally positioned equidistant from said first and second bushings and above said first and second bushings.

2. The high voltage direct current power supply of claim 1 wherein said rectifier assembly comprises first pair of diode assemblies and second pair of diode assemblies connected in a quadrangular shaped full wave bridge circuit having said first AC input terminal adjacent said first bushing and having said second AC input terminal adjacent said second bushing.

3. The high voltage direct current power supply of claim 2 wherein said first pair of diode assemblies are positioned intermediate said first AC input terminal and said DC output terminals and said second pair of diode assemblies are positioned intermediate said second AC input terminal and said DC output terminals.

4. The high voltage direct current power supply of claim 3 wherein said tank means occupies at least 25% of the distance between said high voltage bushings measured between the centerlines thereof.

5. The high voltage direct current power supply of claim 4 further comprising an air space disposed intermediate said tank means and said transformer housing.

6. The high voltage direct current power supply of claim 3 further comprising:
   an inductor in series with said second DC output terminal of said rectifier assembly;
   means for measuring the DC current flow from said rectifier assembly; and
   means for measuring the DC voltage output of said power supply.

7. The high voltage direct current power supply of claim 1 wherein said rectifier assembly comprises a half-wave rectifier having first AC input terminal adjacent said first bushing and having said second AC input terminal adjacent said second AC input terminal.

8. The high voltage direct current power supply of claim 7 wherein said first DC output terminal is grounded and said second DC output terminal is generally positioned equidistant from said first and second bushings, and above said first and second bushings.

9. The high voltage direct current power supply of claim 8 further comprising:
   an inductor in series with the DC output of said rectifier assembly;
   means for measuring the DC current flow from said rectifier assembly; and
   means for measuring the DC voltage output of said power supply.

10. The high voltage current power supply of claim 8 wherein said tank means occupies at least 25% of the distance between said high voltage bushings, measured between the centerlines thereof.

11. The high voltage direct current power supply of claim 10 further comprising an air space disposed intermediate said tank means and said transformer housing.

12. A high voltage direct current supply comprising: a transformer having a metal housing and a pair of transversely spaced generally upwardly extending high voltage bushings; tank means carried by said housing intermediate said bushings and extending generally upwardly from said housing; said tank means being formed of an electrically non-conductive material, having the uppermost end thereof at least no lower than the uppermost ends of said bushings and being adapted to retain a bath of insulating liquid therewithin; rectifier means carried within said tank means so as to be submersible within such a bath; and external input connecting means electrically communicating between respective ones of said bushings and said rectifier means and with the communication thereof to said rectifier means being at respectively transversely spaced side portions of said tank means which are spaced upwardly from the uppermost end of said housing.

13. A high voltage rectifier for mounting on the metallic housing of a transformer having a pair of transversely spaced generally upwardly extending high voltage transformer bushings, comprising: tank means carried by such a housing intermediate such bushings and extending generally upwardly from such a housing; said tank means being formed of an electrically non-conductive material, having the uppermost end thereof at least no lower than the uppermost ends of such bushings and being adapted to retain a bath of insulating liquid therewithin; recitifier means carried within said tank means so as to be submersible within such a bath; and external input connecting means adapted to electrically communicate between respective ones of such bushings and said rectifier means and with the communication thereof to said rectifier means being at respectively transversely spaced side portions of said tank means which are spaced upwardly from the uppermost end of such a housing.

* * * * *